United States Patent
Yoshida et al.

(10) Patent No.: US 6,754,870 B2
(45) Date of Patent: Jun. 22, 2004

(54) CRC OPERATION UNIT AND CRC OPERATION METHOD

(75) Inventors: Takao Yoshida, Kanagawa (JP);
Minoru Okamoto, Osaka (JP);
Masayuki Yamasaki, Osaka (JP);
Kazuhiro Okabayashi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 480 days.

(21) Appl. No.: 09/833,787

(22) Filed: Apr. 13, 2001

(65) Prior Publication Data

US 2002/0002692 A1 Jan. 3, 2002

(30) Foreign Application Priority Data

Apr. 14, 2000 (JP) ........................................ 2000-113734

(51) Int. Cl.[7] ............................................. H03M 13/00
(52) U.S. Cl. ..................................................... 714/758
(58) Field of Search ............................... 714/781, 786, 714/758

(56) References Cited

U.S. PATENT DOCUMENTS

| 4,720,830 A | 1/1988 | Joshi et al. | ................. 714/775 |
| 5,325,372 A | 6/1994 | Ish-Shalom | .................. 714/757 |

(List continued on next page.)

FOREIGN PATENT DOCUMENTS

| EP | 0 936 537 A | 8/1999 |
| EP | 1 096 380 A1 | 5/2001 |

(List continued on next page.)

OTHER PUBLICATIONS

P. Geremia: "Cyclic Redundancy Check Computation: An Implementation Using the TMS320C54x" Texas Instrument Application Report, No. SPRA530, Apr. 1999, pp. XP002171855 *p. 3, line—p. 8, last line * .

(List continued on next page.)

*Primary Examiner*—Albert Decady
*Assistant Examiner*—Shelly A Chase
(74) *Attorney, Agent, or Firm*—McDermott, Will & Emery

(57) ABSTRACT

To enable high-speed CRC operation and flexible use of various generating polynomials without causing significant increase in circuit scale, the CRC operation unit uses circuits generally provided for a DSP and some additional circuits. The CRC operation unit includes: a generating polynomial supply section having a first general register for storing an arbitrary generating polynomial and a selector for selectively outputting the generating polynomial or data of which all bits has a value of 0; an operation data supply section having a memory, a shift register, a second general register, and a barrel shifter, for outputting operation data for CRC operation based on transmitting/receiving data; an operation section for performing CRC operation using the generating polynomial output from the generating polynomial supply section and the operation data output from the operation data supply section; and an operation instruction execution control section for controlling the operations of the above sections.

10 Claims, 6 Drawing Sheets

U.S. PATENT DOCUMENTS

| | | | | |
|---|---|---|---|---|
| 5,390,196 | A | | 2/1995 | Cecil et al. ................. 714/781 |
| 5,768,291 | A | | 6/1998 | Kelton et al. ................ 714/746 |
| 5,870,413 | A | | 2/1999 | Kodama et al. ............ 714/756 |
| 5,878,057 | A | * | 3/1999 | Maa ........................... 714/757 |
| 5,898,712 | A | | 4/1999 | Kodama et al. ............ 714/807 |
| 6,192,498 | B1 | * | 2/2001 | Arato ......................... 714/781 |

FOREIGN PATENT DOCUMENTS

| | | |
|---|---|---|
| JP | 05 151007 | 6/1993 |
| JP | 7-50596 | 2/1995 |
| JP | 10-098392 | 4/1998 |
| JP | 10-107647 | 4/1998 |
| JP | 10-320221 | 12/1998 |
| JP | P2000-81989 A | 3/2000 |
| JP | P2000-311096 A | 11/2000 |
| JP | P2001-36414 A | 2/2001 |
| WO | JP WO00/67125 | 11/2000 |

OTHER PUBLICATIONS

D.V. Sarwate: "Computation of Cyclic Redundancy Checks via Table Look-up" Communications of the ACM, vol. 31, No. 8, Aug. 1988, pp. 1008–1013, XP002171856 *p. 1008, col. 1, line 1—p. 1013, a col. 2; last line *

Filipg: "A Painless Guide to CRC Error Detection Algorithms Index V3.00" http://www.repairfaq.org/filipg/link/f_CRC_V3.html, Sep. 24, 1996, pp. 1–37, XP00271899 *p. 15, line 1—p. 16, line 5 * .

* cited by examiner

CRC OPERATION UNIT AND CRC OPERATION METHOD

BACKGROUND OF THE INVENTION

The present invention relates to a CRC operation unit and a CRC operation method for generating a cyclic redundancy check (CRC) code that is an error detection code for detection of an error occurring in transmitting/receiving data when the transmitting/receiving data is transmitted via a communication path or when the data is processed for transmission, or detecting a code error in transmitting/receiving data to which such an error detection code has been added.

CRC is an error-detecting system frequently used in digital communication, which detects an error in the following manner. On the transmitter side, transmitting data, which is considered as a high-order polynomial, is divided by a predetermined generating polynomial. The resultant remainder is added to the end of the transmitting data as a CRC code (encoding). On the receiver side, the transmitted data is divided by the same generating polynomial (decoding). If the remainder is zero, the transmitted data is determined as having no error. If the remainder is not zero, the transmitted data is determined as having an error (error detection). As the generating polynomial, the following are used in actual CRC, for example.

(1) CRC-12
(2) CRC-16
(3) CRC-CCITT

The encoding and error detection as described above, which are hereinafter called CRC operation, may be implemented by a CRC operation unit that executes CRC operation by hardware. The CRC operation unit uses a divider constructed of a combination of a shift register and an exclusive OR gate. In this type of unit, the generating polynomial is determined by how the shift register is connected with the exclusive OR gate. Therefore, this type of unit is not allowed to change the generating polynomial within one unit. That is, a different unit is required if a different generating polynomial is used. Moreover, it is necessary to provide units capable of using the same generating polynomial on the transmitter and receiver sides.

A unit that executes CRC operation by software is known as a CRC operation unit capable of flexibly using various generating polynomials. This type of unit can easily use various generating polynomials by only changing a program or data. This type of unit however has the following problems. CRC operation, which is normally executed by a processor in a communication terminal, tends to put a great load on the processor, resulting in lowering the processing capability of the communication terminal. Moreover, CRC operation by software is low in operation speed and thus is not suitable for high-speed communication.

Units capable of realizing both flexible use of generating polynomials and high-speed CRC operation have been disclosed. For example, Japanese Laid-Open Patent Publication No. 5-151007 discloses a unit constructed of a combination of a generating polynomial setting register, a shift register, and an exclusive OR gate. This unit performs CRC operation by hardware and thus enables high-speed processing. In addition, the unit can use various generating polynomials by changing the generating polynomial set in the generating polynomial setting register.

The CRC operation unit as described above uses exclusive circuits specialized for CRC operation. This disadvantageously increases the circuit scale of a communication unit and the like. In addition, while it is possible to use various generating polynomials having the same bit length as that of the generating polynomial setting register, no consideration is made for use of generating polynomials having different bit lengths.

SUMMARY OF THE INVENTION

An object of the present invention is providing a CRC operation unit capable of performing high-speed CRC operation and flexibly using various generating polynomials without causing significant increase in circuit scale.

The CRC operation unit of the present invention includes: generating polynomial supply means for holding data representing a generating polynomial and selectively outputting the data representing a generating polynomial or zero data of which all bits have a value of 0; operation data supply means for outputting operation data to be subjected to CRC operation; and arithmetic and logic operation means for performing exclusive OR operation between the data representing a generating polynomial or the zero data and the operation data, wherein the generating polynomial supply means selects the data representing a generating polynomial or the zero data depending on a value of the MSB of operation results from the arithmetic and logic operation means, and the operation data supply means outputs, as the operation data, data composed of: values of bits in lower order than the MSB of the operation results from the arithmetic and logic operation means as values of higher-order bits of the operation data; and a value of the MSB of unprocessed data to be subjected to CRC operation as a value of the LSB of the operation data.

The generating polynomial supply means may include: a first register for holding the data representing a generating polynomial; and a selector for selectively outputting the data representing a generating polynomial or the zero data, for example, and the operation data supply means may include: a second register for holding the operation results from the arithmetic and logic operation means; a shifter for shifting the operation results held in the second register leftward by one bit and outputting results; a memory for holding the unprocessed data to be subjected to CRC operation; and a shift register for holding part of the unprocessed data to be subjected to CRC operation transferred from the memory, outputting a value of the MSB of the held data, and shifting bits of the held data leftward one by one, for example.

With the above construction, the CRC operation unit can easily use various generating polynomials flexibly by changing the data representing a generating polynomial to be held in the generating polynomial supply means. In addition, the selection of the data representing a generating polynomial or the zero data to be input to the arithmetic and logic operation means and the generation of the operation data to be subjected to CRC operation are performed automatically, not by executing a program instruction. This realizes high-speed CRC operation. Moreover, since components provided for normal processors can be primarily used for the generating polynomial supply means, the operation data supply means, and the arithmetic and logic operation means, it is possible to minimize the circuit scale of the entire apparatus including the CRC operation unit.

The CRC operation unit may further include operation instruction execution control means, wherein the operation instruction execution control means controls, under a predetermined operation instruction, output of the data representing a generating polynomial or the zero data by the generating polynomial supply means, output of the operation data by the operation data supply means, and execution of the exclusive OR operation by the arithmetic and logic operation means.

The operation instruction execution control means may control, under a predetermined operation instruction, operations of the generating polynomial supply means, the operation data supply means, and the arithmetic and logic operation means for one-time execution of the exclusive OR operation by the arithmetic and logic operation means.

Alternatively, the operation instruction execution control means may control, under a predetermined operation instruction, operations of the generating polynomial supply means, the operation data supply means, and the arithmetic and logic operation means for execution of the exclusive OR operation for all the unprocessed data to be subjected to CRC operation by the arithmetic and logic operation means.

Otherwise, the operation instruction execution control means may control, under a predetermined operation instruction, operations of the generating polynomial supply means, the operation data supply means, and the arithmetic and logic operation means for execution of the exclusive OR operation for values of all bits held in the shift register by the arithmetic and logic operation means.

With above constructions, it is possible to enhance the flexibility of the CRC processing by increasing the degree of freedom in the combination of operation instructions or enhance the speed of the CRC processing with a small number of operation instructions.

After completion of the exclusive OR operation for all of the unprocessed data to be subjected to CRC operation by the arithmetic and logic operation means, the values held in the second register may be stored in the memory.

Alternatively, after completion of the exclusive OR operation for all of the unprocessed data to be subjected to CRC operation by the arithmetic and logic operation means, whether or not the unprocessed data to be subjected to CRC operation has an error may be determined by examining whether or not the values held in the second register are 0.

The above constructions facilitate CRC encoding and data error detection.

When the number of bits of the data representing a generating polynomial is smaller than the number of bits allowed to be held by the generating polynomial supply means, the generating polynomial supply means may left-justify the data representing a generating polynomial and give 0 to the remaining lower-order bit(s).

The above construction enhances the flexibility of use of various generating polynomials in the number of bits, in addition to the type.

The CRC operation unit of another embodiment of the present invention includes: generating polynomial holding means for holding data representing a generating polynomial; and CRC operation means for performing CRC operation based on the data representing a generating polynomial and data to be subjected to CRC operation, wherein, when the number of bits of the data representing a generating polynomial is smaller than the number of bits allowed to be held by the generating polynomial holding means, the generating polynomial holding means left-justifies the data representing a generating polynomial and gives 0 to the remaining lower-order bit(s).

The above construction enhances the flexibility of use of various generating polynomials in the number of bits, in addition to the type, even in the case of using exclusive circuits specialized for CRC operation.

DESCRIPTION OF THE PREFERRED EMBODIMENTS

Embodiment 1

As EMBODIMENT 1 of the present invention, an example of a CRC operation unit incorporated in a processor such as a digital signal processor (DSP) will be described with reference to FIG. 1. This unit is constructed of circuits generally provided for the DSP and some additional circuits.

Figure 1:
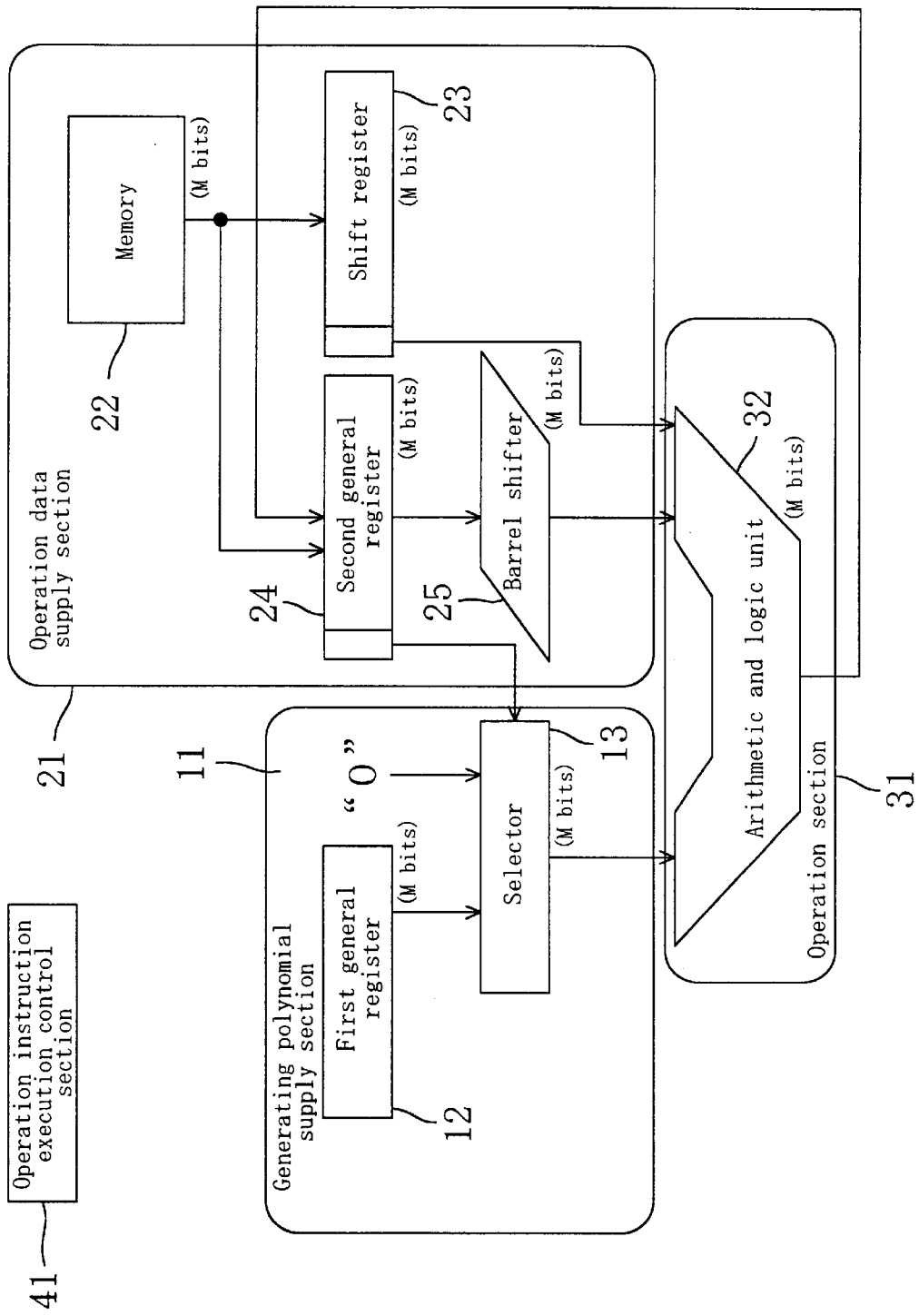
FIG. 1 is a block diagram of a CRC operation unit of EMBODIMENT 1 of the present invention.

Referring to FIG. 1, the CRC operation unit includes: a generating polynomial supply section 11 (generating polynomial supply means) for holding and outputting data representing an arbitrary generating polynomial; an operation data supply section 21 (operation data supply means) for outputting operation data for CRC operation based on transmitting/receiving data; an operation section 31 (arithmetic and logic means) for performing CRC operation using the generating polynomial output from the generating polynomial supply section 11 and the operation data output from the operation data supply section 21; and an operation instruction execution control section 41 (operation instruction execution control means) for controlling the operations of the above sections.

The generating polynomial supply section 11 includes a first general register 12 that stores a generating polynomial and a selector 13. The selector 13 selects the data stored in the first general register 12 (that is, the generating polynomial) or data of which all bits have a value of 0 ("0"), and outputs the selected value. More specifically, the selector 13 selects "0" when the value of the most significant bit (MSB) in a second general register 24 to be described later is 0, or selects the generating polynomial stored in the first general register 12 when the value of the MSB is 1. The selector 13 may actually be constructed of a column of AND circuits that perform AND operation between the respective bits in the first general register 12 and the MSB value in the second general register 24, for example.

The operation data supply section 21 includes a memory 22, a shift register 23, the second general register 24, and a barrel shifter 25.

The memory 22 stores transmitting/receiving data.

The shift register 23 outputs the value of the MSB of the data held therein to the operation section 31 as the value of the LSB of the operation data every cycle of CRC operation and then shifts the held data leftward by one bit. Once all the bits of the held data have been output, subsequent data is transferred to the shift register 23 from the memory 22.

The second general register 24 holds data transferred from the memory 22 as initial values at the start of CRC operation, and thereafter holds data of the operation results output from the operation section 31 every cycle of CRC operation.

The barrel shifter 25 shifts the data held in the second general register 24 leftward by one bit, and then outputs the values of bits in higher order than the LSB of the resultant data to the operation section 31 as the values of bits in higher order than the LSB of the operation data. Note that the value of the MSB in the shift register 23 may be input to the barrel shifter 25, instead of being directly input to the operation section 31 as described above, to be used as the value of the LSB of the operation data during the leftward shifting described above.

The operation section 31 includes an arithmetic and logic unit 32 to execute exclusive OR operation between the generating polynomial or "0" output from the generating polynomial supply section 11 and the operation data output from the operation data supply section 21. The data of the operation results is stored in the second general register 24 as described above.

The respective sections described above have a bit width of M bits, for example.

The operation instruction execution control section 41 controls the operations of components constituting a DSP based on operation instructions provided as a program, and also controls principally the operations of the above sections based on operation instructions relating to CRC operation.

As the first general register 12, the memory 22, the second general register 24, the barrel shifter 25, and the arithmetic and logic unit 32, those normally provided for the processor may be used. In other words, the components specialized for CRC operation are principally the selector 13, the shift register 23, signal paths provided between the sections and the like, and the part of the operation instruction execution control section 41 that has a control function for CRC operation. Only by adding these components to a general processor, the CRC operation unit can be constructed. It is not that the entire the CRC operation unit is tailored for CRC operation. Therefore, increase in the circuit scale of the entire DSP and the like can be minimized.

Figure 2:
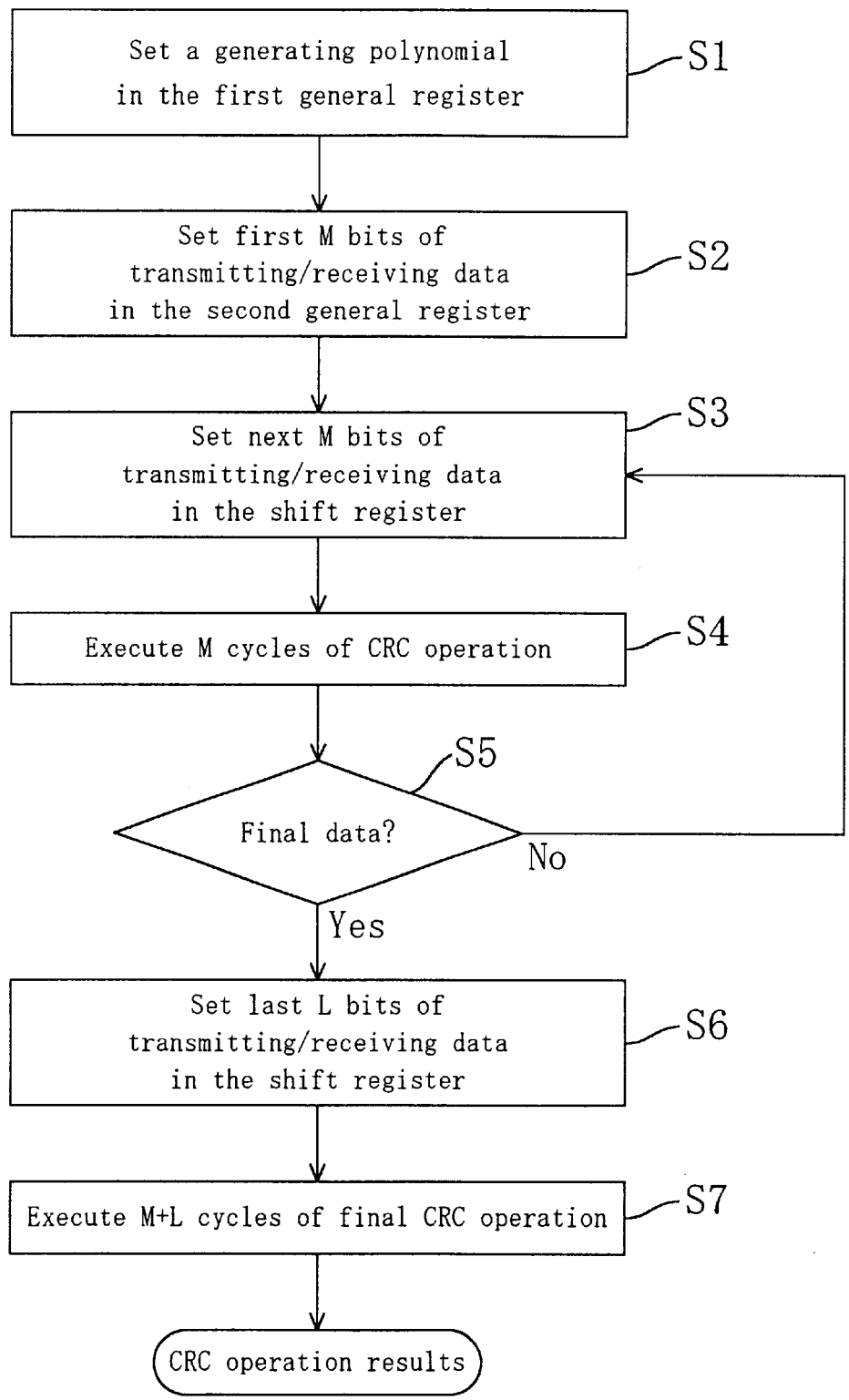
FIG. 2 is a flowchart of the operation of the CRC operation unit of EMBODIMENT 1.

The CRC operation unit constructed as described above performs CRC operation under operation instructions given to the operation instruction execution control section 41. The operation will be described with reference to the flowchart shown in FIG. 2. It should be noted that the following process steps are given for convenience of description of the operation and that the respective steps do not necessarily correspond to instruction cycles and machine cycles one on one.

Step S1: A generating polynomial is set in the first general register 12 under a transfer instruction. The bit length N of the set generating polynomial may be smaller than the bit width M of the first general register 12 (N<M). If this is the case, the generating polynomial set in the first general register 12 is left-justified under a leftward shift instruction and the like and the remaining lower-order bit or bits are filled with 0.

Step S2: Under the transfer instruction, also, data of first M bits (initial data) of the transmitting/receiving data stored in the memory 22 are set in the second general register 24.

Step S3: Also, data of next M bits (input data 1 to X) of the transmitting/receiving data are set to the shift register 23 under the transfer instruction.

Step S4: Next, M cycles of CRC operation for the M bits of the transmitting/receiving data held in the shift register 23 are performed. More specifically, the following operation is performed.

The arithmetic and logic unit 32 performs exclusive OR operation between operation data of total M bits and the M-bit generating polynomial or zero data output from the selector 13. The M-bit operation data is composed of values of higher-order M-1 bits of the data output from the barrel shifter 25, which has shifted the M-bit data held in the second general register 24 as described above, and a value of the MSB output from the shift register 23. The M-bit generating polynomial may be composed of a string of N bits and 0 or 0's. The zero data output from the selector 13 is data of which all bits have a value of 0. The data of the operation results is stored in the second general register 24.

In this way, one cycle of CRC operation corresponding to one bit of the transmitting/receiving data is performed. The data held in the shift register 23 is shifted leftward by one bit, and 0 is given to the LSB. This series of operation is repeated M times under a combination of a repeat instruction (which instructs to repeat the subsequent instruction for a given number of times) and a CRC operation instruction. This enables execution of one cycle of CRC operation (and shift operation of the shift register 23) in one machine cycle, for example. The operation performed under a combination of a repeat instruction and a CRC instruction described above may otherwise be programmed to be realized under a single instruction. It is also possible to set value M for a general register and decrement the value every cycle of CRC operation, to repeat the CRC operation until the value becomes zero, although the processing speed decreases.

Step S5: Once M cycles of CRC operation have completed, whether or not the remaining transmitting/receiving data held in the memory 22 is the final data (whether or not the remaining bits are equal to or less than M) is determined. This determination may actually be done by determining whether or not the value of a pointer not shown indicating the address of the portion of the transmitting/receiving data in the memory 22 to be transferred to the shift register 23 indicates the address of the final data, for example. Alternatively, the determination may be done by counting (counting down) the number of times of M-cycle CRC operation performed, and determining whether or not the M-cycle CRC operation has been repeated by the number of times equal to a quotient X, which is obtained by subtracting M from the total number of bits K of the transmitting/receiving data and integer-dividing the resultant value by M, represented by:

$$X=int((K-M)/M).$$

The count of the number of times of CRC operation and the determination described above may be realized under program instructions, or may be performed automatically by hardware. Note that M is subtracted from K because the first M bits are set in the second general register 24 as the initial data. If the remaining data in the memory 22 is not the final data, the steps S3 to S5 are repeated.

Figure 3:
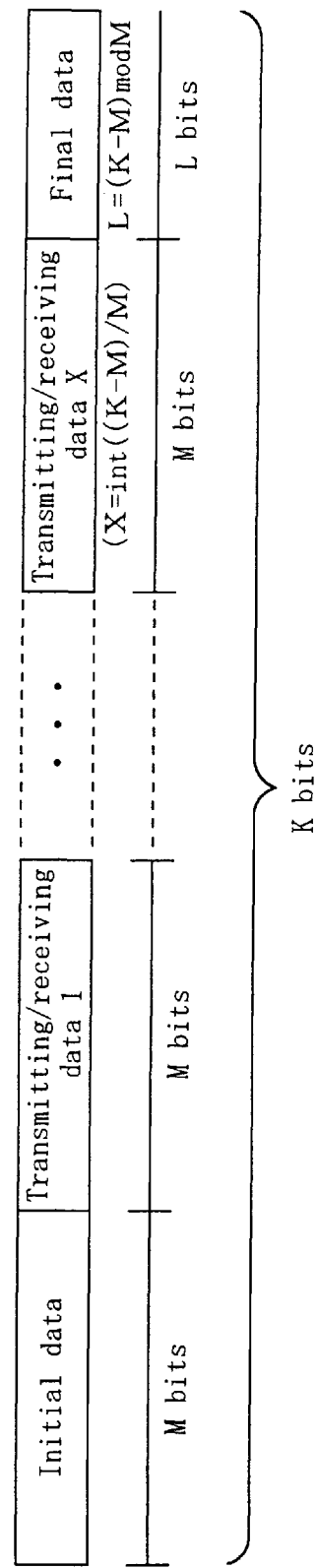
FIG. 3 is a view for description of an example of data separation in the CRC operation unit of EMBODIMENT 1.

Step S6: If the transmitting/receiving data remaining in the memory 22 is determined to be the final data, the final data is transferred to the shift register 23. The number of bits of the final data is equal to a remainder L obtained by subtracting M from the total number of bits K of the transmitting/receiving data and dividing the resultant value by M as shown in FIG. 3, represented by $$L=(K-M) mod M.$$

Since the remainder L is smaller than M, the final data set in the shift register 23 is left-justified and the remaining lower-order bit or bits are filled with 0.

Step S7: Finally, M+L cycles of CRC operation are performed in a manner as described in step S4. Thus, a total of M×X+M+L=K cycles of the CRC operation have been performed. It should be noted that, as the number of cycles to be performed at the final CRC operation, the bit width M of the arithmetic and logic unit 32 is added to the remainder L. This is because the operation is repeated until the last bit of the transmitting/receiving data is shifted to the bit position higher by one than the MSB of the arithmetic and logic unit 32. This is equivalent to multiplying the transmitting/receiving data by the N-th power of 2 and repeating the CRC operation until reaching the LSB of the data. The values held in the second general register 24 when M+L cycles (K cycles in total) of CRC operation have completed in step S7 are the CRC operation results for the entire transmitting/receiving data. In the case of transmission, the values held in the second general register 24 are temporarily stored in the memory 22 and then added to the transmitting data, to provide CRC-encoded transmitting data. In the case of reception, it is examined whether or not the values held in the second general register 24 are 0. As a concrete example, exclusive OR operation may be performed between the values in the second general register 24 and zero data of which all bits have a value of 0 and whether or not a zero flag register not shown has been set may be examined. By this examination, whether or not the received data has an error can be determined.

Figure 4:
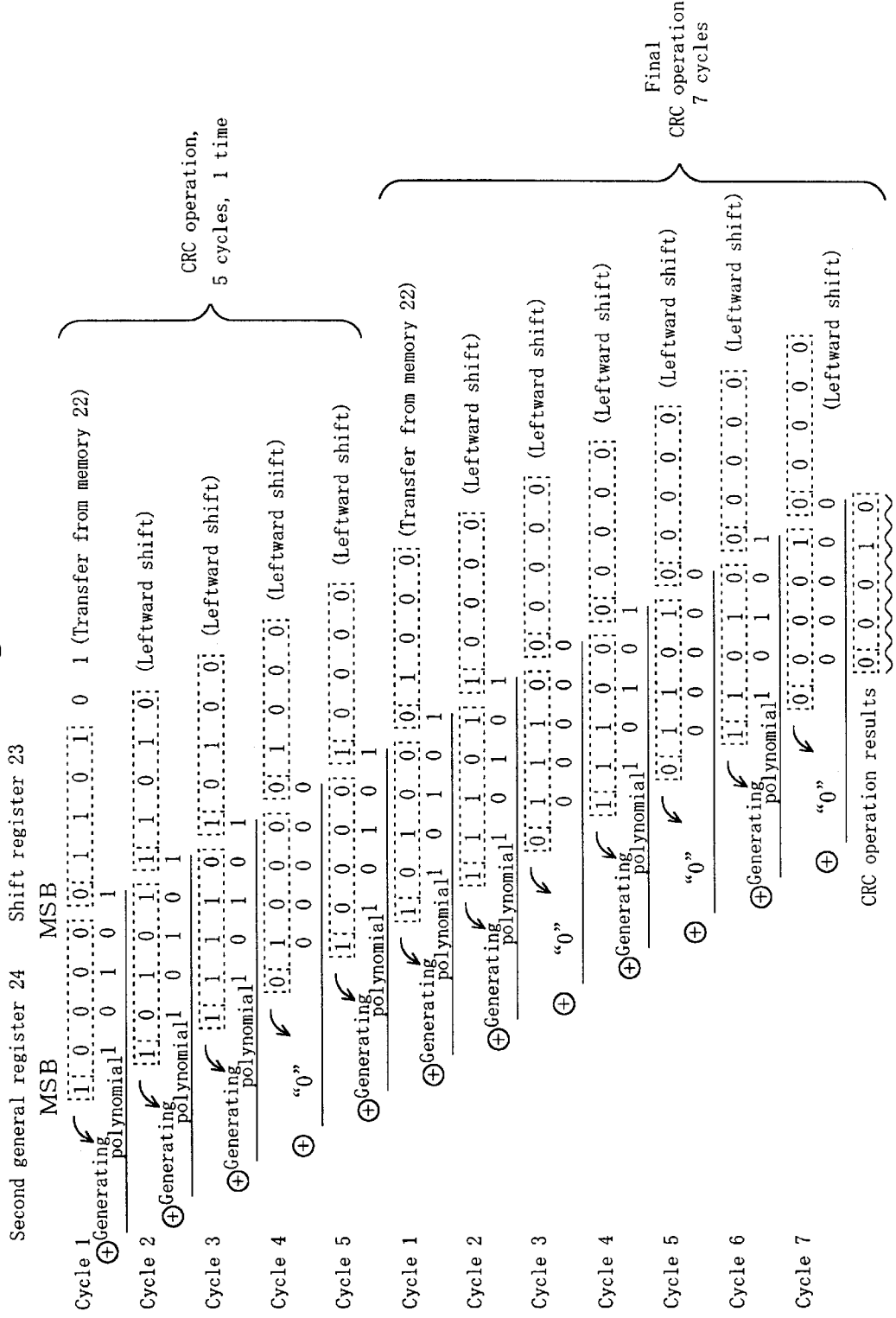
FIG. 4 is a view for description of an example of encoding operation of the CRC operation unit of EMBODIMENT 1.
Figure 5:
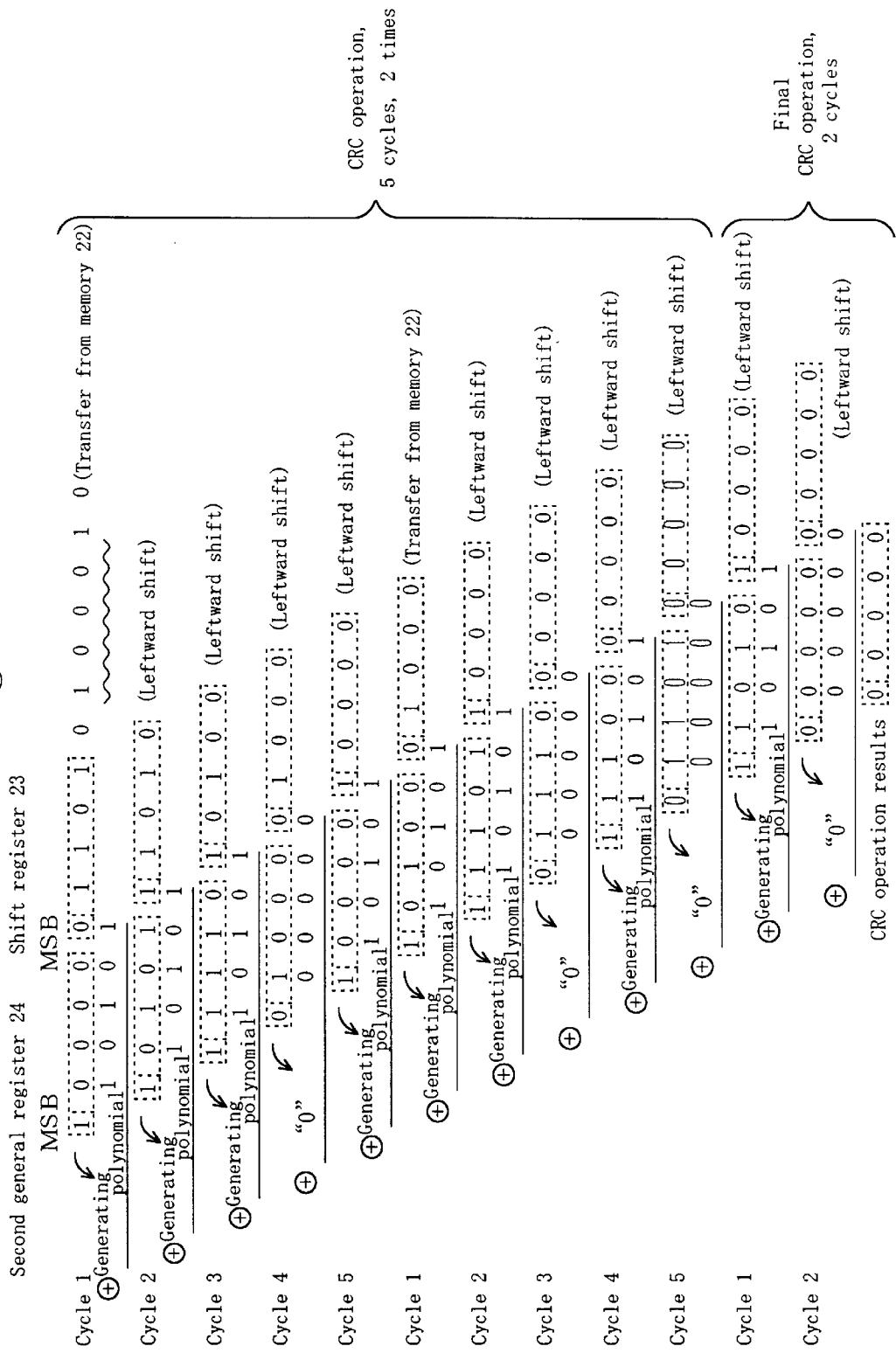
FIG. 5 is a view for description of an example of decoding operation of the CRC operation unit of EMBODIMENT 1.

The above operation will be described using a specific data example with reference to FIGS. 4 and 5.

First, an example of encoding will be described. As shown in FIG. 4, assume that the transmitting data before encoding is "100000110101" (binary notation, the number of bits K=12), and the generating polynomial is "10101" (binary notation, the number of bits N=5). In this case, the number of times X of repetition of 5-cycle CRC operation is $$X=int((K-M)/M)=int((12-5)/5)=1,$$

the number of bits L of the final data is $$L=(K-M)modM=(12-5)mod5=2,$$

and the number of cycles of the final CRC operation is $$M+L=5+2=7.$$

(1) At the start of CRC operation, the generating polynomial "10101" is set in the first general register 12. Also, the values of the first five bits "10000" of the transmitting data are set in the second general register 24, and the values of the subsequent five bits "01101" are set in the shift register 23.

(2) In the first CRC operation cycle 1, the value of the MSB in the second general register 24 is "1". The selector 13 therefore selects the generating polynomial "10101". The arithmetic and logic unit 32 then performs exclusive OR operation between the generating polynomial "10101" and the combination of the values "0000" of the four bits in lower order than the MSB in the second general register 24 (properly, the four bits in higher order than the LSB of data obtained by the leftward shift by the barrel shifter 25) and the value "0" of the MSB in the shift register 23. The operation results are "10101", which are stored in the second general register 24.

(3) The values held in the shift register 23 are shifted leftward by one bit. Although the value given to the LSB is 0 in the example shown in FIG. 4, it is not necessarily 0. (On the contrary, in the final CRC operation, 0 must be given to the LSB to meet the multiplication of the transmitting data by the n-th power of 2.)

(4) The above series of operation is repeated, and when five cycles of CRC operation are completed, the 2-bit final data "01" stored in the memory 22 is transferred to the shift register 23 and set therein in the left-justified manner with the remaining lower-order bit or bits filled with 0. In the final CRC operation, steps as described in (2) and (3) above are repeated for seven cycles.

(5) The values "00010" held in the second general register 24 at the completion of the final CRC operation are the CRC operation results. The CRC operation results are added to the end of the original transmitting data as shown in FIG. 5, to obtain the 17-bit encoded data "10000011010100010".

The operation of decoding the data encoded as described above is as shown in FIG. 5, which is substantially the same as that described in (1) to (4) above for the encoding. If the CRC operation results of this decoding are "00000" as shown in FIG. 5, it is determined that the data has no error.

In the illustrated example, the bit length of the transmitted data including the error detection code as described above is 17 bits. Therefore, the number of times X of repetition of 5-cycle CRC operation is $$X=int((K-M)/M)=int((17-5)/5)=2,$$

the number of bits L of the final data is $$L=(K-M)modM=(17-5)mod5=2,$$

and the number of cycles of the final CRC operation is $$M+L=5+2=7.$$

In decoding, however, it should be noted that if the remainder is 0 after the final CRC operation is repeated for two cycles corresponding to the number of bits L of the final data, it remains to be 0 in the subsequent cycles of CRC operation. If the remainder is not 0, it will never be 0 in the subsequent cycles. Thus, the same operation results are obtained even if the operation is discontinued at the end of two cycles. However, seven cycles of the final CRC operation may be completed as described above, to simplify the construction by performing the same operation on the encoding and decoding sides.

In the above example, the bit widths of the respective components were the same. Alternatively, for example, the first general register 12 and the arithmetic and logic unit 32 may have a different bit width from the other components, or the arithmetic and logic unit 32 may have a different bit width from the first general register 12 and the like.

In the above example, the transmitting/receiving data was stored in the memory 22. When the data is received as serial data, for example, the shift register 23 may be omitted, and the received data may be directly supplied to the second general register 24 and the arithmetic and logic unit 32 from a buffer (first-in, first-out (FIFO)).

In the CRC operation unit described above, the barrel shifter 25 only serves to shift the input data by one bit. Therefore, a shift register may be used instead if the cycle time has an allowance.

If an exclusive register specialized for CRC operation is provided in place of the second general register 24, the barrel shifter 25 may be omitted by shifting the data input/output by one bit.

Memories may be used in place of the first general register 12 and the second general register 24.

The switching control of the selector 13 was done based on the value of the MSB in the second general register 24. Alternatively, for example, a flag register may be provided to hold the value of the MSB of the operation results of the exclusive OR operation performed by the arithmetic and logic unit 32, and the switching may be controlled based on the value held in the flag register. In this case, in order to set the first flag register value for the first cycle of CRC operation, the data may be input to the arithmetic and logic unit 32 without being shifted leftward in the barrel shifter 25 (or by bypassing the barrel shifter 25).

It is also possible to execute the series of CRC operation as described above for all the bits of the transmitting/receiving data by a micro-program incorporated in the operation instruction execution control section 41. The micro-program can be programmed to support the CRC operation with a single or a few program instruction(s).

Embodiment 2

As EMBODIMENT 2, described is an example of a CRC operation unit constructed by hardware including a generating polynomial setting register and capable of using a generating polynomial having an arbitrary bit length.

Figure 6:
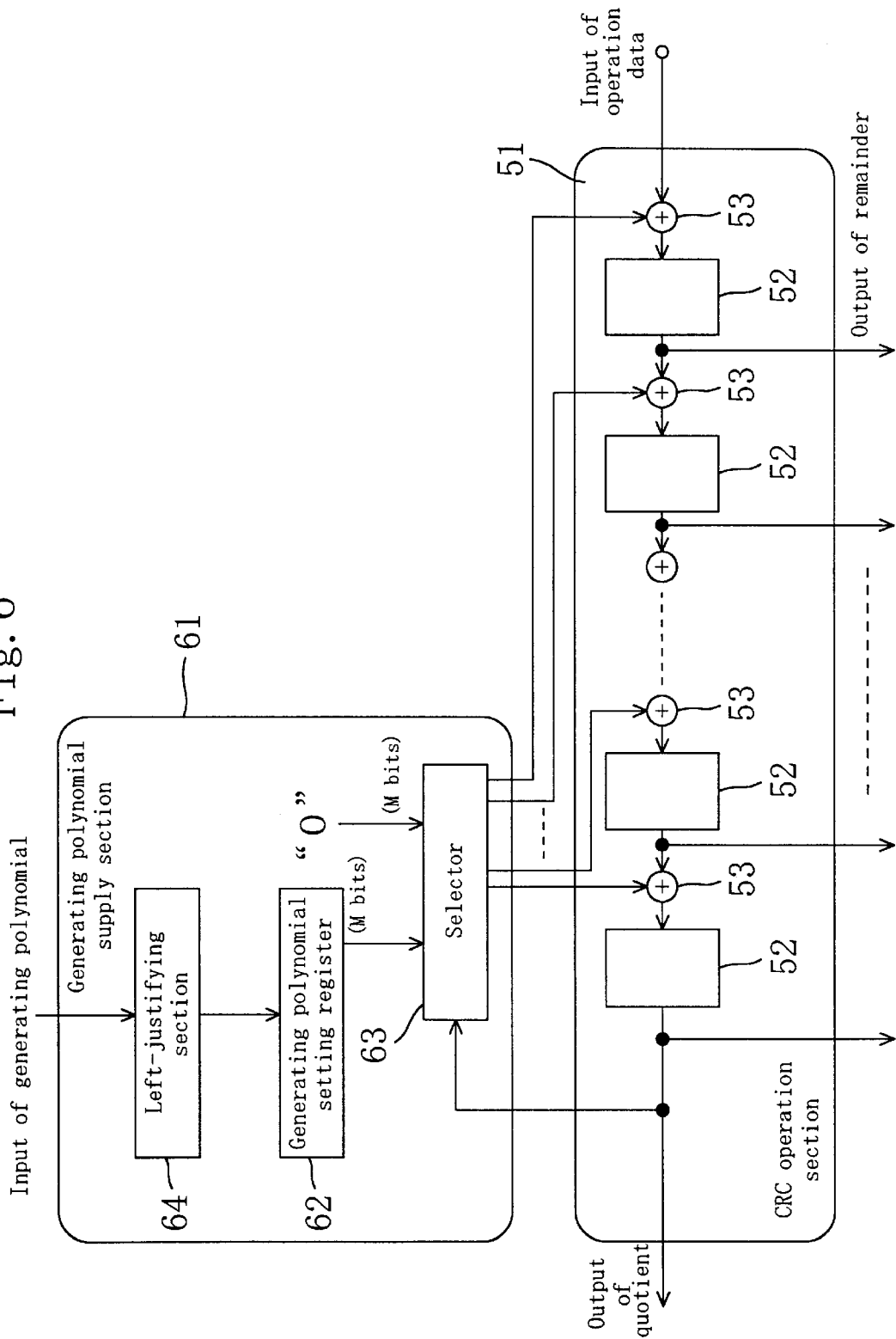
FIG. 6 is a block diagram of a CRC operation unit of EMBODIMENT 2 of the present invention.

Referring to FIG. 6, the CRC operation unit of this embodiment includes a CRC operation section 51 and a generating polynomial supply section 61.

The CRC operation section 51 (CRC operation means) includes M-stage (corresponding to M bits) D-type flipflops 52 connected to one another via exclusive OR gates 53. The CRC operation section 51 receives bits of operation data one by one for CRC operation for each bit. The quotients as the operation results are sequentially output from the last-stage D-type flipflop 52, while the remainders are output from the respective D-type flipflops 52 upon completion of CRC operation at the respective stages.

The generating polynomial supply section 61 includes: an M-bit wide generating polynomial setting register 62 (generating polynomial holding means) that stores a generating polynomial; a selector 63; and a left-justifying section 64. The selector 63 outputs the values stored in the generating polynomial setting register 62 (that is, the generating polynomial) or data of which all bits have a value of 0 ("0") depending on the output from the last-stage D-type flipflop 52, as in the selector 13 of EMBODIMENT 1. The left-justifying section 64 left-justifies the generating polynomial and fills the remaining lower-order bit or bits with 0 when the number of bits N of the generating polynomial used is smaller than the bit width M of the generating polynomial setting register 62, before storing the generating polynomial in the generating polynomial setting register 62. Specifically, the generating polynomial may be shifted leftward by use of a shift register or under a shift instruction in a program. In place of providing the left-justifying section 64, a previously left-justified generating polynomial may be input to the section.

With the above construction, when the number of bits N of the generating polynomial is smaller than the bit width M of the generating polynomial setting register 62, the bit or bits in lower order than the N higher-order bits in the register 62 are 0. Therefore, for each of these lower-order bits, the selector 63 outputs 0 irrespective of the output from the last-stage D-type flipflop 52. As a result, the exclusive OR gate 53 corresponding to each of the lower-order bits outputs the same value as that output from the preceding stage D-type flipflop 52. With this construction, therefore, it is possible to provide the same results as those obtained when the number of bits of the generating polynomial, the bit width of the generating polynomial setting register 62, and the number of stages of the D-type flipflops 52 are the same. This enhances the flexibility of use of various generating polynomials in the number of bits, in addition to the type.

As described above, according to the present invention, components provided for normal processors and the like can be used. This enables high-speed CRC operation and flexible use of various generating polynomials without causing significant increase in circuit scale.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention that fall within the true spirit and scope of the invention.

What is claimed is:

1. A CRC operation unit comprising:

generating polynomial supply means for holding data representing a generating polynomial and selectively outputting the data representing a generating polynomial or zero data of which all bits have a value of 0;

operation data supply means for outputting operation data to be subjected to CRC operation; and arithmetic and logic operation means for performing exclusive OR operation between the data representing a generating polynomial or the zero data and the operation data, wherein the generating polynomial supply means selects the data representing a generating polynomial or the zero data depending on a value of the most significant bit (MSB) of operation results from the arithmetic and logic operation means, and the operation data supply means outputs, as the operation data, data composed of: values of bits in lower order than the MSB of the operation results from the arithmetic and logic operation means as values of higher-order bits of the operation data; and a value of the MSB of unprocessed data to be subjected to CRC operation as a value of the LSB of the operation data.

2. The CRC operation unit of claim 1, wherein the generating polynomial supply means comprises:

a first register for holding the data representing a generating polynomial; and a selector for selectively outputting the data representing a generating polynomial or the zero data, the operation data supply means comprises:

a second register for holding the operation results from the arithmetic and logic operation means;

a shifter for shifting the operation results held in the second register leftward by one bit and outputting results;

a memory for holding the unprocessed data to be subjected to CRC operation; and a shift register for holding part of the unprocessed data to be subjected to CRC operation transferred from the memory, outputting a value of the MSB of the held data, and shifting bits of the held data leftward one by one.

3. The CRC operation unit of claim 2, further comprising operation instruction execution control means, wherein the operation instruction execution control means controls, under a predetermined operation instruction, operations of the generating polynomial supply means, the operation data supply means, and the arithmetic and logic operation means for execution of the exclusive OR operation for values of all bits held in the shift register by the arithmetic and logic operation means.

4. The CRC operation unit of claim 2, wherein after completion of the exclusive OR operation for all of the unprocessed data to be subjected to CRC operation by the arithmetic and logic operation means, the values held in the second register are stored in the memory.

5. The CRC operation unit of claim 2, wherein after completion of the exclusive OR operation for all of the unprocessed data to be subjected to CRC operation by the arithmetic and logic operation means, whether or not the unprocessed data to be subjected to CRC operation has an error is determined by examining whether or not the values held in the second register are 0.

6. The CRC operation unit of claim 1, further comprising operation instruction execution control means, wherein the operation instruction execution control means controls, under a predetermined operation instruction, output of the data representing a generating polynomial or the zero data by the generating polynomial supply means, output of the operation data by the operation data supply means, and execution of the exclusive OR operation by the arithmetic and logic operation means.

7. The CRC operation unit of claim 6, wherein the operation instruction execution control means controls, under a predetermined operation instruction, operations of the generating polynomial supply means, the operation data supply means, and the arithmetic and logic operation means for onetime execution of the exclusive OR operation by the arithmetic and logic operation means.

8. The CRC operation unit of claim 6, wherein the operation instruction execution control means controls, under a predetermined operation instruction, operations of the generating polynomial supply means, the operation data supply means, and the arithmetic and logic operation means for execution of the exclusive OR operation for all the unprocessed data to be subjected to CRC operation by the arithmetic and logic operation means.

9. The CRC operation unit of claim 1, wherein, when the number of bits of the data representing a generating polynomial is smaller than the number of bits allowed to be held by the generating polynomial supply means, the generating polynomial supply means left-justifies the data representing a generating polynomial and gives 0 to the remaining lower-order bit(s).

10. A CRC operation method comprising the steps of:
selectively outputting data representing a generating polynomial or zero data of which all bits have a value of 0;
outputting operation data to be subjected to CRC operation; and
performing exclusive OR operation between the data representing a generating polynomial or the zero data and the operation data,
wherein the step of selectively outputting data representing a generating polynomial selects the data representing a generating polynomial or the zero data depending on a value of the MSB of operation results obtained from a preceding step of performing exclusive OR operation, and
the step of outputting operation data outputs, as the operation data, data composed of: values of bits in lower order than the MSB of the operation results obtained from the step of performing exclusive OR operation as values of higher-order bits of the operation data; and a value of the MSB of unprocessed data to be subjected to CRC operation as a value of the LSB of the operation data.

* * * * *